United States Patent [19]

Imaizumi et al.

[11] Patent Number: 5,326,717
[45] Date of Patent: Jul. 5, 1994

[54] METHOD OF FABRICATING A COMPOUND SEMICONDUCTOR DEVICE

[75] Inventors: Toyoaki Imaizumi; Osamu Oda; Hironobu Sawatari, all of Toda, Japan

[73] Assignee: Nikko Kyodo Co., Ltd., Tokyo, Japan

[21] Appl. No.: 990,707

[22] Filed: Dec. 15, 1992

[30] Foreign Application Priority Data

Dec. 17, 1991 [JP] Japan .................................. 3-353644
Mar. 24, 1992 [JP] Japan .................................. 4-098733

[51] Int. Cl.$^5$ .................................. H01L 21/203
[52] U.S. Cl. .................................. 437/105; 437/176; 437/245; 437/912
[58] Field of Search ............... 437/175, 176, 126, 105, 437/107, 129, 133, 132, 235, 245, 912

[56] References Cited

U.S. PATENT DOCUMENTS 4,845,049  7/1989  Sunakawa .................... 437/126
4,859,627  8/1989  Sunakawa .................... 437/126
5,158,909  10/1992  Ohtsuka et al. ................ 437/176

FOREIGN PATENT DOCUMENTS 0069052  3/1989  Japan ......................... 437/176

OTHER PUBLICATIONS

Licata et al., "Application of Photodeposited Cd to Schottky barrier Diode and Transistor Fabrication on InP and $In_{0.53}Ga_{0.47}As$ Substrates", in Appl. Phys. Letts., 58(8), Feb. 1991, 845.

Massies et al., "Monocrystalline Alluminium Ohmic Contact to n-GaAs by $H_2S$ Adsorption", in Appl. Phys. Letts., 38(9), May 1981, 693-695.

Primary Examiner—Olik Chaudhuri
Assistant Examiner—Ramamohau Rao Paladugu

[57] ABSTRACT

A method of fabricating a Schottky electrode by the adsorption of thin layer with not more than 10 monolayers of a metal whose oxide is stable on a III-V compound semiconductor substrate such as InP or on a substrate, the surface on which epitaxial layer is grown, and the successive oxidation of the thin metal film is disclosed. Since the generation of dangling bonds at the interface due to the elastic strain between the substrate and the metal oxide can be prevented, it becomes possible to obtain a Schottky electrode with a high Schottky barrier height and thus to fabricate MESFETs and Schottky diodes having good characteristics such as a small reverse leak current and a large break-down voltage.

3 Claims, 4 Drawing Sheets 5,326,717

METHOD OF FABRICATING A COMPOUND SEMICONDUCTOR DEVICE

BACKGROUND OF THE INVENTION

1. Field of the Invention

The present invention is related to a fabrication method for fabricating a compound semiconductor device and a method of fabricating the same, and is especially related to the most effective technology to be applied to fabricate a Schottky diode, a MESFET (Metal-semiconductor Field Effect Transistor), etc. on a InP single crystal or its ternary or quaternary mixed crystal substrate.

2. Disclosure of the Prior Art

Even though much research has been performed on compound semiconductors such as GaAs and InP, having electron mobilities higher than that of Si and being radiation resistive and heat resistive, which semiconductors are considered to be promising for the future high-frequency and high-speed electronic devices, MOSFETs formed of such compound semiconductors have not yet been put to practical use because stable oxide layers with low interface level density can not be obtained. In the case of GaAs, MESFETs are put to practical use and thereby discrete high-frequency FETs and small scaled digital ICs are put to practical use. GaAs MESFETs have, however, a disadvantage in that it is impossible to fabricate large scaled digital ICs with the high fabrication yield because the Schottky barrier voltage is small and the logic amplitude is not large.

On the other hand, since InP has a large electron saturation velocity, the thermal conductivity being 1.5 times larger than that of GaAs and the break-down voltage being large, the application of InP for FETs is investigated with the expectation that it may be a material for super high-speed devices, especially high output super high-frequency devices.

InP has however a disadvantage that the reverse leak current is too large and the gate voltage is too small for its practical use because the Schottky barrier height of InP is small (0.3–0.4 eV) compared with GaAs (0.8 eV). In the case of InP, many investigations have been therefore performed on MISFETs by depositing insulating layers such as $SiO_2$, $SiN_x$, $Al_2O_3$, $PN_x$ at low temperatures by CVD, plasma CVD, light-excited CVD, sputtering and evaporation methods.

MISFETs with good properties however could not be obtained because interface level densities between the insulating layer and the substrate are considerably large even for MISFETs with insulating layers grown by low temperature deposition.

There is also a technology related to diodes and MESFETs with improved Schottky barrier height wherein cadmium metal is deposited with the thickness of 200 A on an InP substrate or on an InGaAs substrate and a Schottky electrode is formed on Cd metal (Appl. Phys. Lett. 58(1991), 25).

This technology can considerably improve the Schottky barrier height but it is still limited to 0.55–0.70 eV.

The present invention has been developed under the above mentioned circumstances. It is an object of the present invention to provide MESFETs and Schottky diodes on III-V compound semiconductor substrates, having Schottky electrodes with good characteristics such as a low reverse current and a high gate break-down voltage, and a method of fabricating the same.

It is another object of the present invention to provide InP MESFETs and InP Schottky diodes which have a Schottky barrier height comparable to that of GaAs, and a method of fabricating the same.

SUMMARY OF THE INVENTION

In order to realize the above-mentioned objects, in the present invention, a Schottky electrode is formed on a substrate, the surface on which a III–V compound semiconductor layer such as InP is epitaxially grown, or on a III–V compound semiconductor substrate through a metal oxide layer which is formed by adsorbing metal thin layers with not more than 10 monolayers of a metal whose oxide is stable and by the successive oxidation of the metal thin layers.

As the metal adsorption methods, there are several methods such as the gas phase transport method in which metal thin layers are formed on the substrate by flowing a carrier gas from the metal source position to the substrate position, the molecular beam epitaxy method or the evaporation method in which a metal source is heated and evaporated to adsorb metal thin layers on the substrate in vacuum, and the metalorganic vapor phase epitaxial growth method by which metal thin layers are formed on the substrate by using metalorganic sources. Among various methods, the present invention prefers to the gas phase transport method in which metal thin layers are formed on a substrate by flowing a carrier gas from the metal source position to the substrate position by controlling the temperature of the substrate position to be higher than the temperature of the metal source position with the temperature range between 0.1° and 10° C.

As metal sources, Be, Mg, Al, Si, Ca, Ti, Fe, Co, Ni, Cu, Zn, Ga, Ge, As, Zr, Ag, Cd, Sn, Sb, Te, Cs, Pb, Bi and Ce can be applied.

Since a metal oxide layer can be interposed between the semiconductor substrate and the Schottky electrode with the thickness of not more than 1 monolayers by the above-mentioned method, the generation of dangling bonds due to the elastic strain between the substrate and the metal oxide layer is prevented, allowing a Schottky electrode with a sufficiently high barrier height to be obtained and therefore to obtaining MESFETs and Schottky diodes with Schottky electrodes whose reverse bias current is small and break-down voltage is large. In the case of metal oxide layer with the thickness of more than 10 monolayers, the elastic limit is surpassed and defect levels due to dangling bonds at the interface are formed because of the stress at the interface.

For depositing metal thin layers with not more than 10 monolayers, there are methods such as the gas phase transport method, the molecular beam epitaxy method, the vacuum evaporation method and the metal organic vapor phase epitaxy methods. It is however necessary to lower the deposition rate or to improve the controllability of the deposition time for depositing very thin metal layers with not more than 10 monolayers.

In order to lower the deposition rate, the source temperature can be decreased for reducing the vapor pressure of the source. This however gives a problem in that the purity is deteriorated because of the incorporation of impurities due to the reduction of the substrate temperature.

In order to improve the controllability of the deposition time, a more sophisticated control system must be developed to enable quicker operation of the valve opening-closing and the shutter opening-closing.

On the other hand, in the case of the gas phase transport method, when the metal thin layers are adsorbed by setting the temperature of the substrate position to be higher than the temperature of the metal source position with the temperature range between 0.1° and 10° C., metal atoms are chemically adsorbed within the range of 2–3 monolayers, principally with a monolayer being independent of the deposition time, and therefore one can obtain metal thin layers with not more than 10 monolayers without any problem. Metals are strongly bonded to the substrate by this method.

Even in the case of the molecular beam epitaxy and the vacuum evaporation method, when the temperature of the metal source position and the substrate position are similarly controlled, the same effect can be obtained.

DESCRIPTION OF THE PREFERRED EMBODIMENTS

The present invention is explained below for the case of forming a Schottky electrode on a InP substrate.

EXAMPLE 1

An Fe doped semi-insulating InP substrate on which an n type InP layer doped with silicon is epitaxially grown by vapor phase epitaxy is prepared. The n type InP epitaxial layer has a carrier concentration of $2 \times 10^{17}$ cm$^{-3}$ and a thickness of 0.2 μm.

Figure 1:
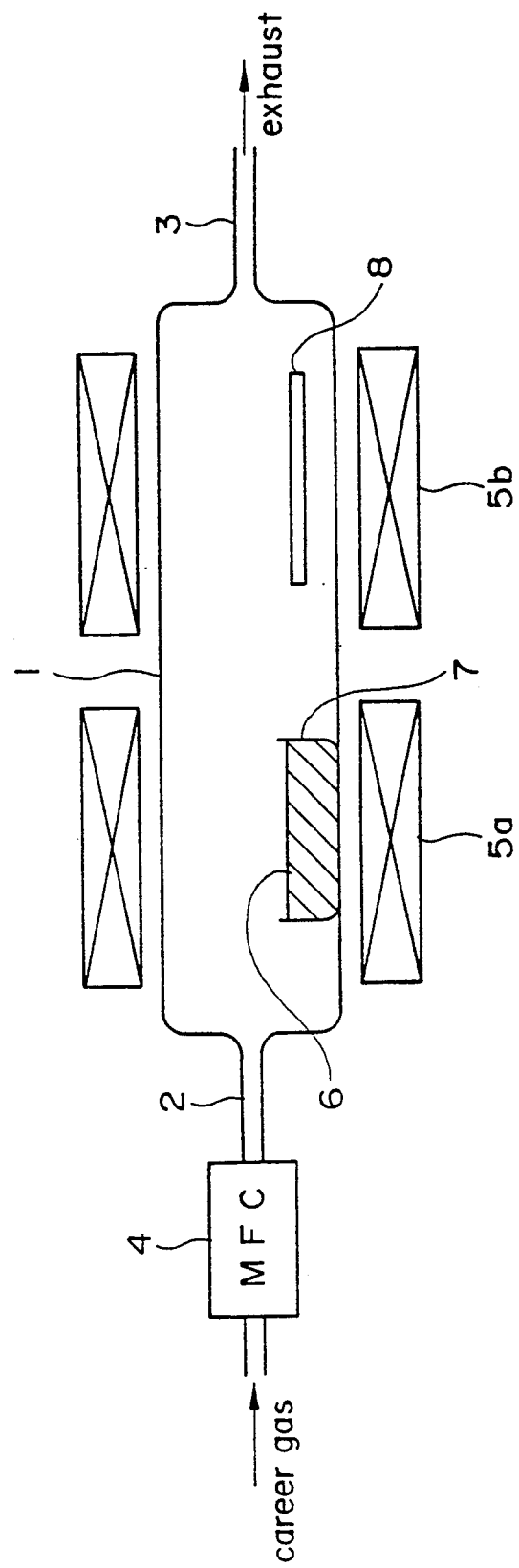
FIG. 1 An example of an apparatus suitable for the formation of metal thin layers in the present invention (cross sectional figure)
Figure 2:
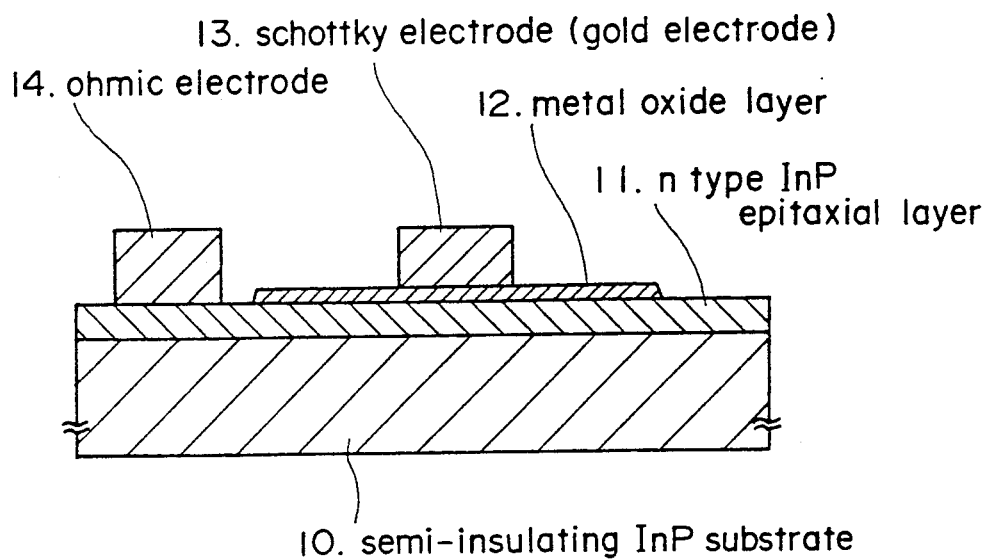
FIG. 2 The cross sectional figure of a device fabricated by the example 1.

Metal thin layers are formed on said substrate by an apparatus as shown in FIG. 1.

In FIG. 1, 1 is a cylindrical quartz reaction tube, one side (the left side in the figure) of which is connected to a gas inlet pipe 2 and the other side (the right hand side in the figure) of which is connected to the gas outlet pipe 3.

In the middle of said gas inlet pipe 2, a mass flow controller 4 is installed and the gas flow through the quartz reaction tube 1 can be regulated. Around the quartz reaction tube, heaters 5a and 5b are arranged for controlling the temperature in the reaction tube.

In this example, at the upstream part of said quartz reaction tube, a boat 7 with a metal source 6 whose oxide is stable is arranged and at the lower stream part of the quartz reaction tube, in InP substrate 8 is arranged. Electricity is then supplied to said heaters 5a, 5b in order to control the temperature of the substrate position T2 as being higher than the temperature of said source boat position with the temperature range between 0.1° C. and 10° C. From the gas inlet 2, hydrogen or inert gas such as argon is flowed for carrying the vapor from the source metal in the boat 7 to the down stream part of the reaction tube to grow metal thin layers with not more than 10 monolayers by the chemical adsorption of metal atoms to the InP substrate 8.

In this way, by controlling the temperature of the substrate position T2 as being higher than the temperature of the source boat T1 with the temperature range between 0.1° C. and 10° C. and by carrying the metal vapor to the substrate position, metal thin layers with less than 10 monolayers can be grown. When the temperature of the substrate position T2 is lower than the temperature of the source boat position T1 (T2<T1), it becomes impossible to control the thickness with the level of several monolayers because the deposition of the source metal to the substrate takes place unidirectionally. If the temperature difference between T2 and T1 is lower than 0.1°C., the deposition rate is varied due to the temperature fluctuation and it becomes difficult to control the thickness with the level of several monolayers. When the temperature difference between T2 and T1 is higher than 10° C. the adsorption of the metal on the substrate will not proceed.

After the formation of the metal thin layers of the level of several monolayers on the substrate, the carrier gas from said gas inlet 2 is switched to oxygen to form a metal oxide layer 12 by oxidizing the metal thin layers on the InP substrate 8, and a Schottky electrode 13 is formed on said metal oxide layer 12 by a method such as electron beam evaporation. An Ohmic contact 14 is independently formed.

In the present example, metals such as Be, Mg, Al, Si, Ca, Ti, Fe, Co, Ni, Cu, Zn, Ga, Ge, As, Zr, Ag, Cd, Sn, Sb, Te, Cs, Pb, Bi, or Ce, whose oxides are stable are used as the metal source.

As an example, Cd is used as the metal source and the temperature difference between the temperature of the substrate position T2 and the temperature of the source boat T1 is controlled to be 2° C. After Cd is adsorbed with the thickness less than 10 monolayers on the surface of the InP substrate, Cd is oxidized and a Au electrode of 1500A is formed on the metal oxide 12 to fabricate a Schottky diode. For devices made by varying the temperature of the substrate position, voltage-current characteristics are measured by varying the applied voltage between the electrodes 13 and 14. As a result, a good Schottky barrier with the height of up to 0.8 eV, higher than the barrier height, 0.5 eV, for conventional InP Schottkya electrodes, with the leak current of $1 \times 10 - 6$A/cm2 at the reverse volatage of 2 V and with the break-down voltage of 90 V can be obtained.

The substrate surface after the formation of the metal oxide layer by the adsorption of Cd thin layers on the substrate surface and by the successive oxydation is measured by Auger electron spectroscopy, and it is found that Cd oxide layers with several monolayers are formed.

EXAMPLE 2

An n type InP substrate (n=$5 \times 10^{15}$cm$^{-3}$) with a AuGe/Ni/Au Ohmic electrode on the back side is prepared. After the surface of the substrate is etched, thin layers of a metal whose oxide is stable are formed by a molecular beam epixtaxy apparatus as shown in FIG. 3.

Figure 3:
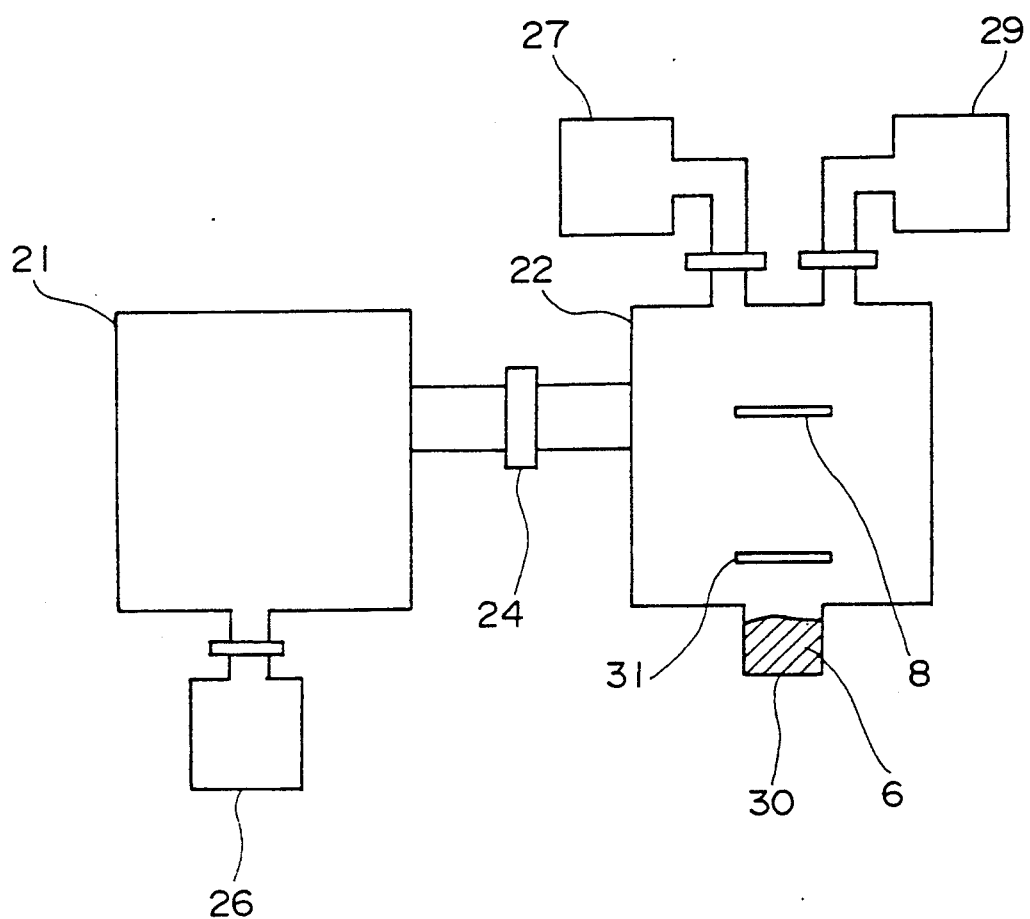
FIG. 3 An example of an apparatus suitable for the formation of metal thin layers by a molecular beam epitaxy apparatus in the present invention.

In FIG. 3, 21 and 22 are stainless steel chambers where 21 is the substrate perapration chamber, and 22 is the adsorption chamber. The substrate can be transferred between each chamber and when the transfer is not performed, the chambers are isolated by a gate valve 24. Turbo molecular pumps 26 and 27 are installed in each chamber and an ion pump 29 is installed to the chamber 22 and thus the higher vaccum condition can be achieved. The reaching vacuum is not more than $1 \times 10^{-9}$Torr at the chamber 22 and not more than $1 \times 10^{-8}$Torr at the chamber 21.

A crucible 30 with a heater is installed in the chamber 22 and a metal source is charged into the crucible 30 and heated by the heater in order to evaporate the metal source for depositing metal atoms to the surface of the substrate which is located to the upper part of the crucible. The metal layer thickness can be controlled by opening and closing a cell shutter on the crucible. The chamber 22 is connected to a oxygen supply line and the gas flow rate can be regulated with a mass flow controller.

As an example, Cd (purity 6N) is used for the metal source. A substrate is cleaned in the preparation chamber 21 by heating the substrate to 150° C. in vacuum of not more than $1 \times 10^{-7}$Torr for evaporating adsorbed substances such as water. The substrate is then transfered to the growth chamber 22 and is cleaned by evaporating oxides on the substrate surface by heating the substrate up to 350° C. in vacuum of not more than $5 \times 10^{-8}$Torr. The cleanliness was determined by RHEED pattern observation. The crucible is then heated to 325° C. and the substrate to 330° C. The intensity of the molecular beam is regulated to $1 \times 10^{-8}$Torr and the cell shutter 31 is opended in order to form a Cd adsorption layer of the level of 1-2 monolayers on the substrate. During this operation, the gate valve is closed.

Figure 4:
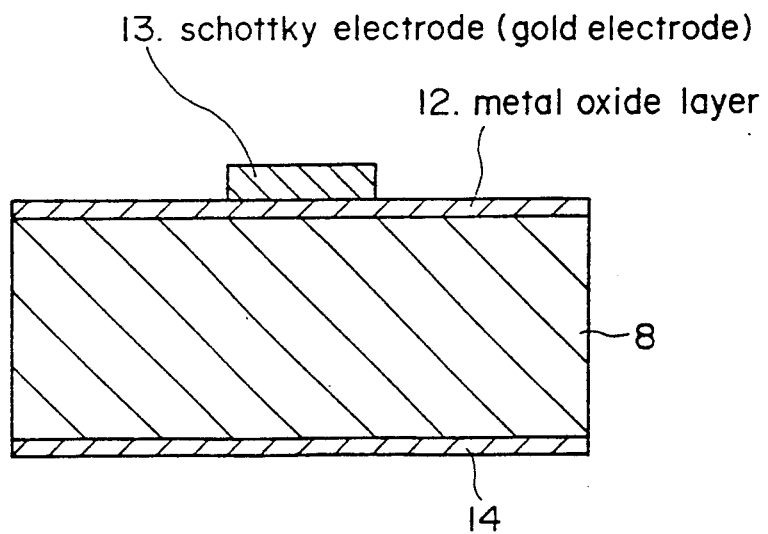
FIG. 4 The cross sectional figure of a device fabricated by the example 2.

The oxygen gas is then introduced in the chamber 22 and the Cd layer on the substrate surface is oxydized. After the formation of Cd oxide layers, chamber 22 is vacuumed and the substrate is transferred from the chamber 22 to the chamber 21 and removed from the chamber. A gold electrode 12 with the thickness of 1500A is formed on the Cd oxide layer 12 by an electron beam evaporation apparatus for fabricating a Schottky diode as shown in FIG. 4. For fabricated devices, the current-voltage characteristics are measured by changing the applied voltage between the electrodes 13 and 14. As a result, good characteristics are observed, with the maximum Shottky barrier height of 0.8 eV, being higher than 0.5 eV of the conventional InP Schottky electrodes, with the leak current of $1 \times 10^{-6}$A/cm$^2$, and with the break-down voltage of 90 V.

In this example, solid Cd is used as the metal source but metal organic (such as dimethylcadmium) can be applied.

In the present example, the formation of a Schottky electrode on a InP substrate is explained but the technology can be applied to the formation of Schottky electrodes on the other III-V compound semiconductor substrates and on the substrates on which III-V compound semiconductor layer is epitaxially grown.

As explained above, in the present invention, since a Schottky electrode on a substrate, the surface on which a III-V compound semiconductor layer is epitaxially grown, or on a III-V compound semiconductor substrate through a metal oxide layer which is formed by adsorbing metal thin layers with not more than 10 monolayers of a metal whose oxide is stable and by the succesive oxidation of said metal thin layer, the generation of dangling bonds due to the elastic strain between the substrate and the metal oxide layer is prevented, allowing the Schottky electrode to have a sufficiently high barrier height and therefore allows fabrication MESFETs and Schottky diodes with Schottky electrodes whose reverse bias current is small and breakdown voltage is large.

Since thin layers of a metal whose oxide is stable are adsorbed by vapor phase transport, molecular beam epitaxy, vacuum deposition or metal organic vapor phase epitaxy on the surface of a compound semiconductor substrate and are oxidized, this method has an effect to form metal oxide layer with less than 10 monolayers without surface defects and to obtain Schottky electrode with less interface level density and with a sufficiently high Schottky barrier height.

What is claimed is:

1. A method of fabricating a compound semiconductor device comprising:

adsorbing a metal thin layer with not more than 10 monolayers of a metal whose oxide is stable, on a substrate, the surface on which a III-V compound semiconductor is epitaxially grown, or on a III-V compound semiconductor substrate, by flowing a carrier gas from a source material to a substrate, wherein the temperature at the substrate is controlled to be higher by 0.1° to 10° C. than that at the source material;

forming a metal oxide layer by oxidizing the metal thin layer, and forming a Schottky electrode on the metal layer.

2. A method of fabricating a compound semiconductor device comprising adsorbing a metal thin layer in claim 1 by heating a metal source and evaporating the metal on the substrate in a vaccum vessel.

3. A method of fabricating a compound semiconductor device comprising adsorbing a metal thin layer in claim 1 by using a metal organic source.

* * * * *

UNITED STATES PATENT AND TRADEMARK OFFICE
CERTIFICATE OF CORRECTION

PATENT NO. : 5,326,717
DATED : July 5, 1994
INVENTOR(S) : Toyoaki IMAIZUMI et al.

It is certified that error appears in the above-indentified patent and that said Letters Patent is hereby corrected as shown below:

On the title page, in box 73, please change the Assignee from "Nikko Kyodo Co., Ltd." to -- Japan Energy Corporation --.

Signed and Sealed this

Twenty-eight Day of February, 1995

*Attest:*

BRUCE LEHMAN

*Attesting Officer*     *Commissioner of Patents and Trademarks*